United States Patent [19]

Haynes

[11] Patent Number: 5,512,843

[45] Date of Patent: Apr. 30, 1996

[54] MONITORING METHOD AND APPARATUS USING HIGH-FREQUENCY CARRIER

[75] Inventor: Howard D. Haynes, Knoxville, Tenn.

[73] Assignee: Martin Marietta Energy Systems, Inc., Oak Ridge, Tenn.

[21] Appl. No.: 151,682

[22] Filed: Nov. 15, 1993

[51] Int. Cl.$^6$ .................................................. G01R 31/34
[52] U.S. Cl. .............................................. 324/772; 322/99
[58] Field of Search ................................... 324/772, 107; 322/99; 318/490; 73/596

[56] References Cited

U.S. PATENT DOCUMENTS

| | | |
|---|---|---|
| 4,224,652 | 9/1980 | Florentzis . |
| 4,689,546 | 8/1987 | Stephens et al. . |
| 4,884,023 | 11/1989 | Schmidt et al. . |
| 4,965,513 | 10/1990 | Haynes et al. . |
| 4,978,909 | 12/1990 | Hendrix . |
| 5,115,672 | 5/1992 | McShane ................................. 73/596 |
| 5,153,506 | 10/1992 | Trenkler et al. . |

FOREIGN PATENT DOCUMENTS

142055A1 8/1988 U.S.S.R. .

OTHER PUBLICATIONS

Vincent Del Toro: *Electromechanical Devices for Energy Conversion and Control Systems* Published by Prentice-Hall, Inc., Chapter 4, pp. 174–178.
Application Data–AC, MG1–1987, Part 14 pp. 6–7.

*Primary Examiner*—Ernest F. Karlsen
*Assistant Examiner*—Russell M. Kobert
*Attorney, Agent, or Firm*—E. A. Pennington; J. M. Spicer; H. W. Adams

[57] ABSTRACT

A method and apparatus for monitoring an electrical-motor-driven device by injecting a high frequency carrier signal onto the power line current. The method is accomplished by injecting a high frequency carrier signal onto an AC power line current. The AC power line current supplies the electrical-motor-driven device with electrical energy. As a result, electrical and mechanical characteristics of the electrical-motor-driven device modulate the high frequency carrier signal and the AC power line current. The high frequency carrier signal is then monitored, conditioned and demodulated. Finally, the modulated high frequency carrier signal is analyzed to ascertain the operating condition of the electrical-motor-driven device.

22 Claims, 4 Drawing Sheets

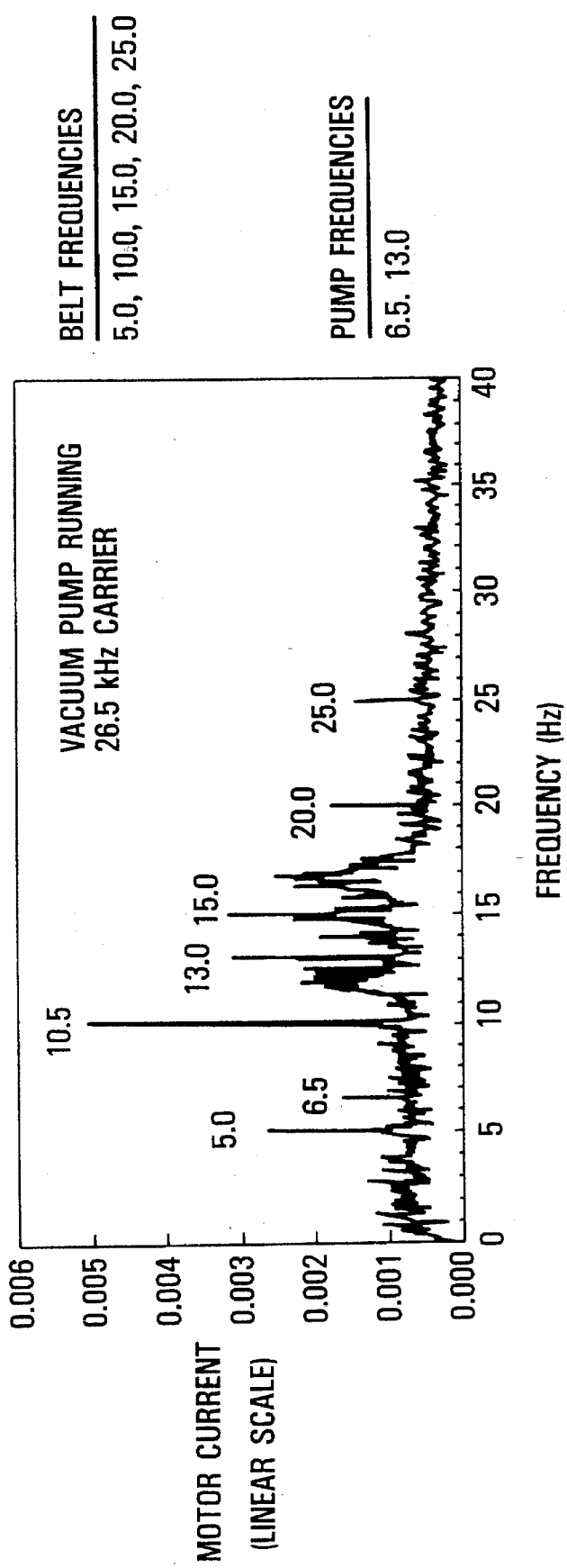

MONITORING METHOD AND APPARATUS USING HIGH-FREQUENCY CARRIER

This invention was made with Government support under contract DE-AC05-84OR21400 awarded by the U.S. Department of Energy to Martin Marietta Energy System, Inc. and the Government has certain right in this invention

FIELD OF THE INVENTION

The present invention relates generally to electrical signal analysis such as motor current signature analysis (MCSA), and more particularly, to an apparatus and method for monitoring machine operation based on the analysis of a signal which varies with machine operation. A high frequency carrier signal is introduced into the machine operational signal, such as a machine power source, and the carrier signal is filtered and demodulated to identify specific operational parameters.

BACKGROUND OF THE INVENTION

Electrical-motor-driven devices have found use in a wide variety of applications. Many of these applications require regular monitoring to ensure that the motor is properly functioning. MCSA is an effective method for efficiently, reliably and non-intrusively monitoring the condition of electrical-motor-driven devices. MCSA permits individuals to determine the operating condition of rotating equipment. The operating condition can then be related to the maintenance needs of the equipment.

MCSA is based upon the transduction of signals back to the power line via an electrical motor. For example, mechanical vibrations in alternating current (AC) rotating equipment are transduced back to the power line via the electrical motor. Additionally, electrical characteristics of the motor are also transduced back to the power lines. The transduced signals modulate the power line current.

U.S. Pat. No. 4,965,513 to Haynes et al. and U.S. Pat. No. 4,978,909 to Hendrix et al., are examples of the use of motor current signals in assessing the condition of a motor. Both of these patents teach the conditioning and analysis of a motor current signal. As shown in the aforementioned Haynes et al. and Hendrix et al. patents, the signals necessary for MCSA are typically monitored by attaching a current transformer to a lead of the electrical motor. Once the signals are gathered they are conditioned, sampled and analyzed in the frequency-domain with a discrete Fourier transform (DFT). Any periodic time-domain vibrations and fault data produced by the motor are displayed as peaks in the frequency spectra.

The large signal produced by the AC power line current, and its harmonics, is also displayed in the frequency spectra at a magnitude that can be several orders of magnitude greater than the signals of interest. The spectra of motor current data for these large power line frequencies are expansive and Gaussian in nature when they are sampled by conventional methods. As a result, any anomalies having a frequency near the frequency of the AC power line current are difficult to evaluate and precisely define.

Another major difficulty in existing MCSA techniques is analyzing electrical current frequency information across a wide bandwidth that is already contaminated with 60 Hz and 60 Hz multiples (harmonics) that are always present in AC power supplied to residential, commercial, and industrial users. Power lines in many locations may also contain frequency noise components that are induced in the power lines by other large motor-driven devices. The presence of these power line noise frequencies can complicate and obstruct attempts to analyze electrical current signals.

Another problem associated with prior MCSA techniques is, in some cases, the inability to effectively detect and analyze modulations (e.g., electrical current modulations from a motor-driven device) that are greater than the carrier frequency (generally the AC power line current having a frequency of 60 Hz). An examination of raw motor current signals from an electrically powered device, having modulating mechanical and electrical loads, reveals that each power line harmonic is modulated. These modulated harmonics show up as modulation sidebands appearing on opposite sides of each power line harmonic. When modulations of 30 Hz and greater are present, these sidebands overlap. This adds considerable difficulty to analyzing raw current frequency spectra and processed signals. For example, a 40 Hz modulation creates the following sidebands:

| from 60 Hz: | $60 - 40 = 20$ Hz |
| --- | --- |
| | $60 + 40 = 100$ Hz |
| from 120 Hz: | $120 - 40 = 80$ Hz |
| | $120 + 40 = 160$ Hz |
| from 180 Hz: | $180 - 40 = 140$ Hz |
| | $180 + 40 = 220$ Hz |
| from N × 60 Hz: | $(N \times 60) - 40$ |
| | $(N \times 60) + 40$ |

As a result of the sidebands shown above, it can be difficult to determine whether an observed electric current frequency component is an upper sideband or a lower sideband, and of what power line harmonic.

Attempts have been made to overcome many of the problems associated with MCSA. For example, Soviet Certificate of Invention No. 1,420,555 describes analyzing an injected current for high reliability fault detection. Additionally, U.S. Pat. No. 4,224,652 to Fiorentzis describes a method and apparatus for detecting ground shorts in the rotor circuit of a generator. The patent describes the delivery of a test signal to the electrical network containing the generator's rotor circuit. As a result, a response signal is produced which is indicative of the ground short derived from the network. The test signal utilized in accomplishing the method may be at the network frequency.

Examples of other techniques for monitoring electrical motor conditions are disclosed in U.S. Pat. No. 4,884,023 to Schmidt et al. (use of an impressed current to determine the rotor resistance of a rotating field machine), U.S. Pat. No. 5,153,506 to Trenkler et al. (an AC reference voltage source is used to determine the winding temperature of electric machines), and U.S. Pat. No. 4,689,546 to Stephens et al. (use of current signals by an electrical generator control system).

A continuing need exists for a monitoring apparatus and method which provides efficient, convenient, and reliable determination of the operating condition of machinery, such as electrical-motor-driven devices.

SUMMARY OF THE INVENTION

An object of the present invention is to provide a method and apparatus for monitoring the condition of an electrical-motor-driven device in an efficient, convenient and reliable manner.

Another object of the present invention is to provide a method and apparatus which utilizes a high frequency carrier signal to minimize the influence of the power line current, and its harmonics.

Another object of the present invention is to provide an apparatus and method of monitoring machine operation in which the ability to detect and analyze modulations greater than the power line frequency is enhanced. These and other objects are achieved by the subject invention which provides an apparatus for monitoring a machine which generates a first signal which varies in accordance with machine operation, comprising means for injecting a second high frequency carrier signal onto the first signal to produce a third, modulated carrier signal, means for demodulating the carrier signal, and means, coupled to the demodulating means, for correlating characteristics of the demodulated carrier signal to machine operating conditions.

By injecting a high frequency carrier signal onto the power line current, the present method and apparatus provide a clearer raw signal. As a result, the raw signal may analyzed across a wider bandwidth than permitted by prior methods and apparatuses.

Other objects advantages and salient features of the invention will become apparent from the following detailed description, which taken in conjunction with the annexed drawings, discloses a preferred but non-limiting embodiment of the subject invention.

BRIEF DESCRIPTION OF THE DRAWINGS

FIGS. 2a, 2b, and 2c are frequency spectra obtained in accordance with methodology of the present invention.

DETAILED DESCRIPTION OF THE PREFERRED EMBODIMENT

The wide range of applications for electrical-motor-driven devices has necessitated the development of techniques for monitoring the condition of such devices. As discussed above, MCSA allows individuals to remotely monitor the condition of electrical-motor-driven devices.

The present invention improves upon prior MCSA techniques by injecting a high frequency signal onto the nominally 60 Hz AC power line current (supplying power to electrical-motor-driven devices). The added high frequency signal is a high frequency carrier modulated by motor current diagnostic information. The injected high frequency carrier is then demodulated and analyzed to provide machine operation information.

Figure 1:
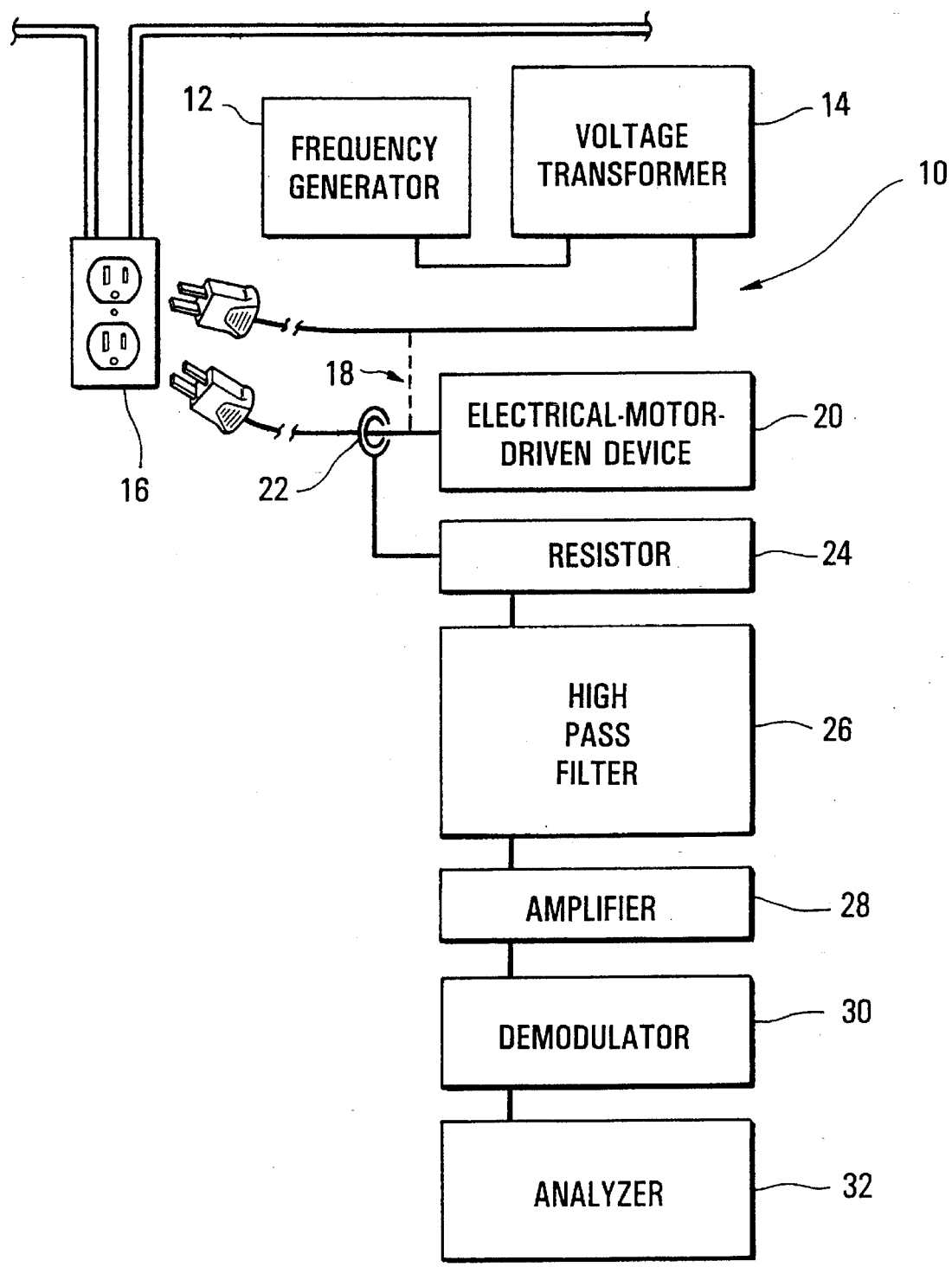
FIG. 1 is a schematic view of a preferred embodiment of the present invention.

With reference to FIG. 1, an apparatus 10 for monitoring machine operation includes a frequency generator 12 which outputs a predetermined high frequency carrier signal. The frequency generator may be of any suitable type, such as an R.F. signal generator with sine wave output. The carrier signal is delivered to a step up transformer 14 to increase the voltage of the carrier signal to a level consistent with the power line voltage. Of course, if the output of the generator is already at a sufficient voltage level, the transformer, or other comparable means, would not be necessary.

In the illustrated embodiment, the output of the transformer 14, which is the high frequency carrier signal, is injected or introduced to the power line current by any suitable means. The injection may be accomplished intrusively or non-intrusively. intrusively. For example, as a non-intrusive method the output of the transformer 14 could be connected to the power line through a standard receptacle 16. As an intrusive method, the output of the transformer 14 could be spliced into a power line at the machine which is to be monitored, as shown by broken line 18 in FIG. 1.

The detected modulated resultant signal is monitored by a clamp-on current transformer 22. The monitored signal is then delivered to signal processing means through a resistor 24, which may or may not be incorporated into the transformer 22. The signal processing means includes a high pass filter 26 which has a frequency response selected to pass desired frequencies, typically well beyond the line current frequency and its significant harmonics. The modulated resultant signal will contain normal AC power line current frequencies and the injected high frequency carrier signal, all of which are modulated by the mechanical and electrical characteristics of the electrical-motor-driven device 20. The output of the high pass filter 26 may be amplified by an amplifier 28.

The filtered and amplified signal is then demodulated with a demodulator 30. As a result, the modulations of the high frequency carrier signal induced by the electrical-motor-driven device can be more easily viewed and analyzed. The demodulator 30 may be based on amplitude modulation (AM), phase modulation (PM), frequency modulation (FM), rms-to-dc conversion, or other suitable and well known principles, and can be used to detect the modulated high frequency carrier signal. Following demodulation, the signal is passed to a signal analyzer 32 for analysis and eventual correlation of the signal to a machine condition.

Alternatively, the modulated high frequency carrier signal could be acquired and analyzed using synchronous sampling techniques or any other techniques presently being employed to analyze 60 Hz based modulations.

Synchronous sampling denotes sampling periodic amplitude modulations of a periodic carrier wave at precisely uniform intervals locked to the carrier frequency and at a rate which is a power of two times the carrier frequency. More specifically, synchronous sampling involves preselecting a sampling rate that follows the Nyquist criterion and is a multiple of two times the carrier frequency. Additionally, the starting point of each sampling cycle is dynamically adjusted by beginning each sampling cycle at a predetermined point in time along the carrier wave.

Figure 2A:
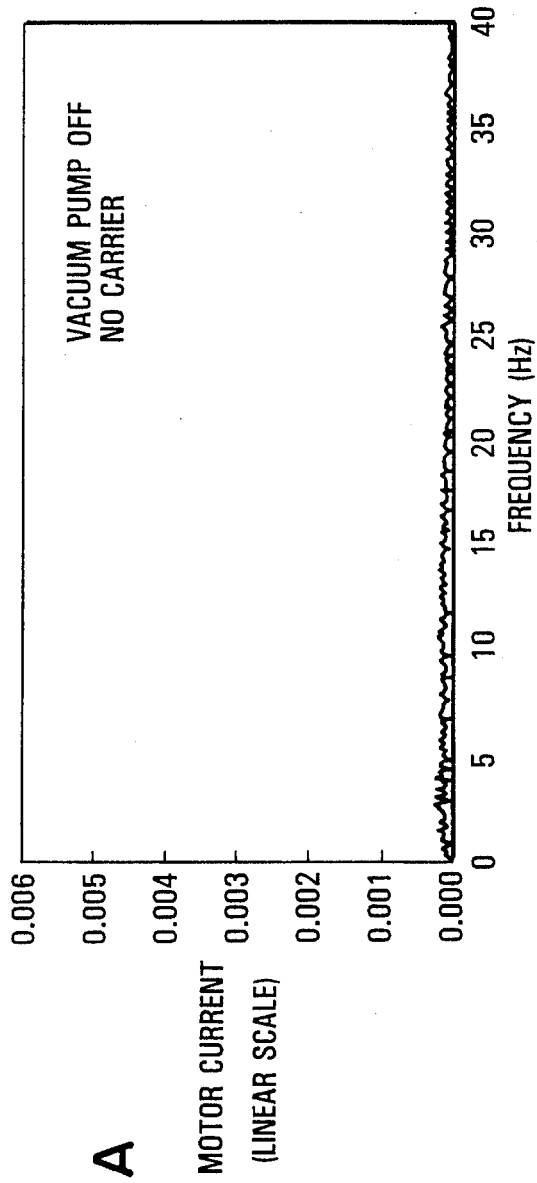
Figure 2B:
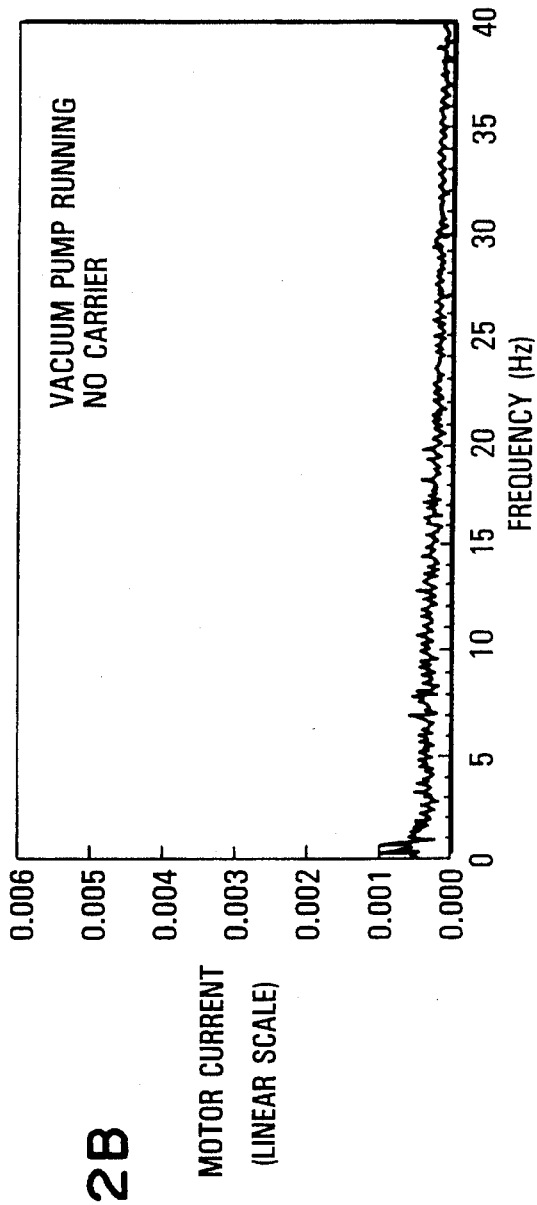

As illustrated in FIGS. 2a, 2b, and 2c, the electrical and mechanical characteristics of a vacuum pump are easily observed after obtaining demodulated motor current signals in accordance with the invention. Specifically, the condition of a vacuum pump was monitored by injecting a high frequency carrier signal of 26.5 kHz onto a 60 Hz AC power line current via a voltage transformer having a 117 VAC primary voltage side and 6.3 VAC secondary voltage side. The modulated resultant current signal was monitored by a current transformer and passed through a 250 ohm resistor. The signal was then filtered by a ROCKLAND DUAL FILTER having a pair of 20 kHz high pass (with 20 dB gain) filters. Subsequently, the signal was amplified via a 500 gain amplifier and demodulated by an rms-to-dc converter. Finally, the signal was analyzed by a WAVEPAK Signal Analyzer.

The stationary frequencies shown in FIGS. 2a, 2b, and 2c reflect vacuum pump fundamental and harmonic frequencies. Specifically, FIG. 2a shows the frequency spectrum obtained when the vacuum pump was off and the high frequency carrier signal was not injected onto the AC power line current. FIG. 2b shows the frequency spectrum obtained when the vacuum pump is running, but the high frequency carrier signal has not been injected onto the AC power line current. In contrast to FIGS. 2a and 2b, FIG. 2c shows the frequency spectrum obtained when the vacuum pump is running, and the high frequency carrier signal is injected onto the AC power line current and demodulated in accordance with the method discussed above.

Additional frequency bands were observed between 11 and 18 Hz in the demodulated 26.5 kHz data (see FIG. 2c). These bands were observed to drift noticeably from side-to-side (to lower and higher frequency locations) while the vacuum pump was operating, and thus appear to be connected to the operating characteristics of the vacuum pump.

Figure 3A:
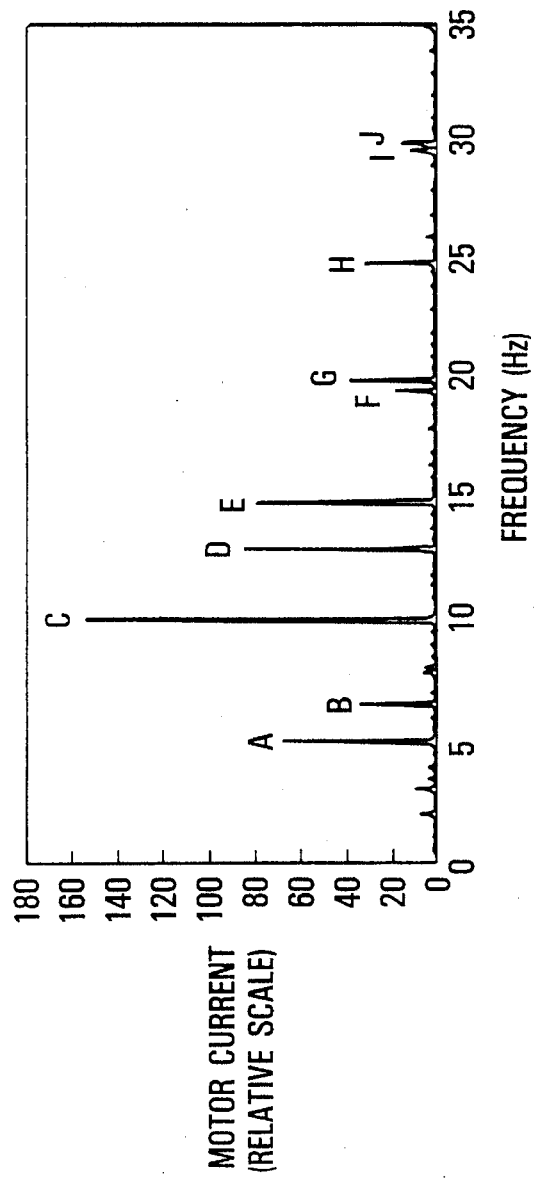
FIGS. 3a and 3b are frequency spectra of a vacuum pump comparing the measured mechanical vibrations with the demodulated motor current signal obtained in accordance with the present invention.
Figure 3B:
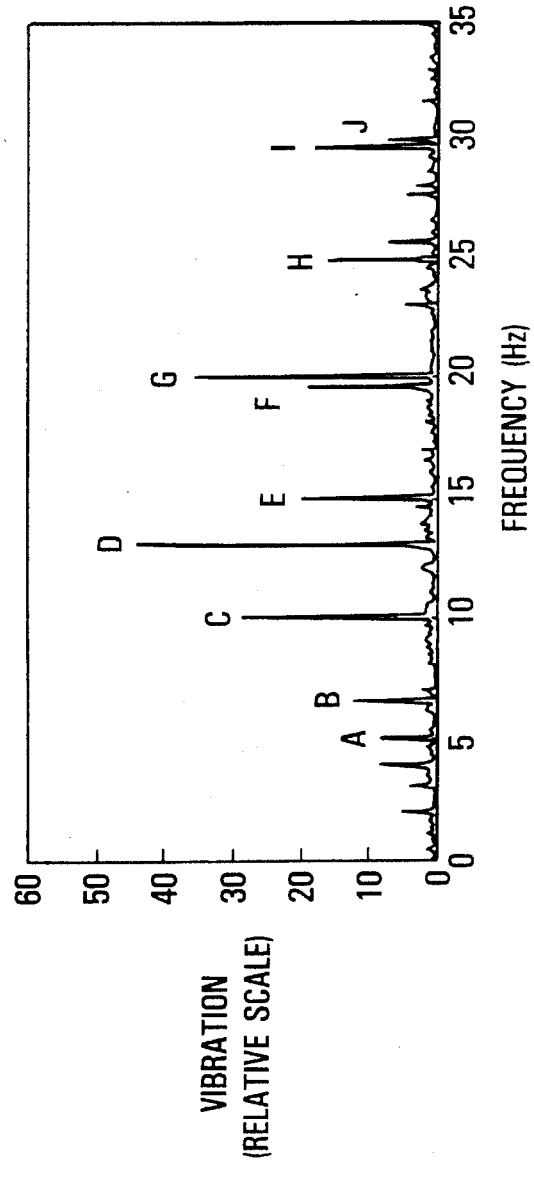

FIGS. 3a and 3b show a comparison of mechanical vibrations within the vacuum pump discussed above and the amplitude demodulated motor current signal of the same vacuum pump. FIG. 3a shows the frequency spectrum of the mechanical vibrations within the vacuum pump. The frequency spectrum was obtained by conventional diagnostic methods.

As labelled in FIGS. 3a and 3b, "A" corresponds to the belt rotation fundamental, "B" corresponds to the pump rotation fundamental, "C", "E""G""H" and "J" correspond to belt rotation harmonics, "D" and "F" correspond to pump rotation harmonics and "I" corresponds to motor shaft speed.

In theory and in practice, modulating phenomena are more difficult to analyze when their frequency (or frequencies) is (are) greater than that of their carrier. As a result of the high frequency carrier signal employed by the present invention, modulations may be analyzed across a much wider frequency band than allowed by prior techniques (e.g., several thousand Hz).

The present invention may be used on AC power lines (e.g., single phase, three phase, 120v, 240v, 480v, etc.). Additionally, the invention may also be applied to DC power lines and DC powered devices as well. The invention may rely on other means for generating a signal which varies in accordance with motor operations, such as Hall Effect sensors, tachometers, accelerometers, etc. Electric current analysis may be carried out using this invention on a periodic or continuous basis using either portable or permanently-installed electronics.

The high frequency carrier signal is selected so that it is far removed from the normal AC power line current frequency components. Specifically, the high frequency carrier signal should be far removed from frequency components of the AC power line current, which are generally 60 Hz based. One application of the invention utilizes the frequency generator 12 to inject a high frequency carrier signal at 26.5 kHz onto the 60 Hz AC power line current via the voltage transformer 14.

While the preferred embodiment makes use of demodulation techniques (e.g., circuitry), demodulation is not a necessary element of the invention. The modulated high-frequency carrier can be monitored and analyzed in it's raw, modulated form as well. Several commercially-available motor diagnostic systems presently determine motor health via an analysis of the sidebands around the 60 Hz fundamental line frequency in the raw (modulated) motor current signal. These systems could be modified and enhanced via the present invention by analyzing the sidebands around the modulated high-frequency carrier in a similar manner.

It will appreciated to those skilled in the art that various modifications and applications of the subject method and apparatus may be made without departing from the spirit and scope of the invention as set forth in the following claims which are attached hereto and form part of this application.

What is claimed is:

1. A method for monitoring a machine which generates a first electrical signal which varies in accordance with machine operation, comprising the steps of:

injecting a second high frequency carrier electrical signal onto the first electrical signal to produce a third, modulated carrier electrical signal;

demodulating the third carrier electrical signal; and correlating characteristics of the demodulated carrier signal to machine operating conditions.

2. A method according to claim 1, further comprising the step of excluding from the modulated carrier signal all frequencies below a value corresponding to a power frequency and its significant harmonics prior to the demodulating step.

3. A method according to claim 2, wherein the excluding step comprises high pass filtering the modulated carrier signal.

4. A method according to claim 2, wherein the first signal is a power line current signal and the second high frequency carrier signal has a frequency of at least 1 kHz.

5. A method according to claim 4, wherein the second high frequency carrier signal has a frequency of at least 26.5 kHz.

6. A method according to claim 1, wherein the correlating step comprises analyzing the demodulated carrier signal in a frequency domain, and determining peak frequencies which correspond to particular operating conditions.

7. A method according to claim 1, further comprising amplifying the third modulated signal prior to the demodulating step.

8. A method according to claim 1, wherein the first signal is an AC power line current.

9. An apparatus for monitoring a machine which generates a first electrical signal which varies in accordance with machine operation, comprising:

means for injecting a second high frequency carrier electrical signal onto the first electrical signal to produce a third, modulated carrier electrical signal;

means for demodulating the third carrier electrical signal; and means, coupled to the demodulating means, for correlating characteristics of the demodulated carrier signal to machine operating conditions.

10. An apparatus according to claim 9, further comprising means for excluding from the modulated carrier signal all frequencies below a value corresponding to a power frequency and its significant harmonics prior to demodulation.

11. An apparatus according to claim 10, wherein the excluding means comprises a high pass filter disposed between the first signal and the demodulator means.

12. An apparatus according to claim 10, wherein the first signal is a power line current signal and the second high frequency carrier signal has a frequency of at least 1 kHz.

13. An apparatus according to claim 12, wherein the second high frequency carrier signal has a frequency of at least 26.5 kHz.

14. An apparatus according to claim 9, wherein the correlating means includes means for analyzing the demodulated carrier signal in a frequency domain, and means for determining peak frequencies which correspond to particular operating conditions.

15. An apparatus according to claim 9, further comprising means for amplifying the third modulated signal prior to the demodulation.

16. An apparatus according to claim 9, wherein the first signal is an AC power line current.

17. An apparatus according to claim 9, wherein the machine includes an electric motor, the first signal is an AC power line current powering the electric motor and the injecting means comprises a frequency generator and a voltage transformer disposed between the frequency generator and the power line current.

18. An apparatus according to claim 17, further comprising means for coupling both an output of the voltage transformer and the AC power line current together.

19. An apparatus according to claim 18, wherein the coupling means comprises an electrical receptacle.

20. A method for monitoring an electrical-motor-driven device powered by an AC power line current, comprising the steps of:

injecting a high frequency carrier signal onto said AC power line current, wherein electrical and mechanical characteristics of said electrical-motor-driven device modulate said high frequency carrier signal and said AC power line current to produce a modulated resultant current signal;

high pass filtering said modulated resultant current signal;

demodulating said filtered, modulated resultant current signal; and analyzing said modulated resultant current signal to ascertain the operating condition of said electrical-motor-driven device.

21. A method for monitoring a machine which generates a first electrical signal which varies in accordance with machine operation, comprising the steps of:

injecting a second high frequency carrier electrical signal onto the first electrical signal to produce a third, modulated carrier electrical signal to produce a third, modulated carrier electrical signal; and correlating characteristics of the third, modulated carrier electrical signal to machine operating conditions.

22. A method according to claim 21, wherein the correlating step comprises analyzing sidebands of the injected second high frequency carrier signal.

\* \* \* \* \*